United States Patent
Shen et al.

(10) Patent No.: US 7,204,750 B2
(45) Date of Patent: Apr. 17, 2007

(54) AIRFLOW GUIDE STRUCTURE AND MANUFACTURE THEREOF

(75) Inventors: Ben Hung-Ping Shen, Taipei (TW); Chei-Ju Tsai, Taipei (TW); Han-Tun Chen, Taipei (TW); Ting-Chiang Huang, Taipei (TW)

(73) Assignee: First International Computer, Inc., Taipei (TW)

( * ) Notice: Subject to any disclaimer, the term of this patent is extended or adjusted under 35 U.S.C. 154(b) by 0 days.

(21) Appl. No.: 10/988,643

(22) Filed: Nov. 16, 2004

(65) Prior Publication Data
US 2005/0113016 A1    May 26, 2005

(30) Foreign Application Priority Data
Nov. 20, 2003   (TW) ............................... 92132514 A

(51) Int. Cl.
*H05K 5/02*    (2006.01)
(52) U.S. Cl. .................... 454/184; 361/697; 361/695; 165/80.3
(58) Field of Classification Search ............... 361/695, 361/697; 165/80.2, 80.3; 454/184
See application file for complete search history.

(56) References Cited

U.S. PATENT DOCUMENTS

| | | | |
|---|---|---|---|
| 5,456,632 A * | 10/1995 | Ohtsu et al. ................. | 454/184 |
| 6,155,920 A * | 12/2000 | Pan et al. .................... | 454/184 |
| 6,711,016 B2 * | 3/2004 | Chung et al. ............... | 361/695 |
| 2003/0188847 A1 * | 10/2003 | Lai et al. .................... | 165/80.2 |
| 2004/0004812 A1 * | 1/2004 | Curlee et al. ............... | 361/687 |
| 2005/0041392 A1 * | 2/2005 | Chen .......................... | 361/695 |

* cited by examiner

*Primary Examiner*—Gregory Wilson
(74) *Attorney, Agent, or Firm*—Troxell Law Office, PLLC

(57) ABSTRACT

An airflow guide structure and manufacture thereof is used to allow components of an airflow guide are cut by molds in a factory to form thin plates in each of which has a plurality of bendable lines, and transported into a mainframe assembly plant to store therein. Each component of the airflow guide is folded into a three-dimensional type at a production line when a mainframe wants to be assembled. Because each component of the airflow guide is a thin plate and lighter in weight, it can be stacked together with another component before a three-dimensional cover body is assembled. Therefore, the space is saved and the transportation and storage are more convenient.

14 Claims, 8 Drawing Sheets

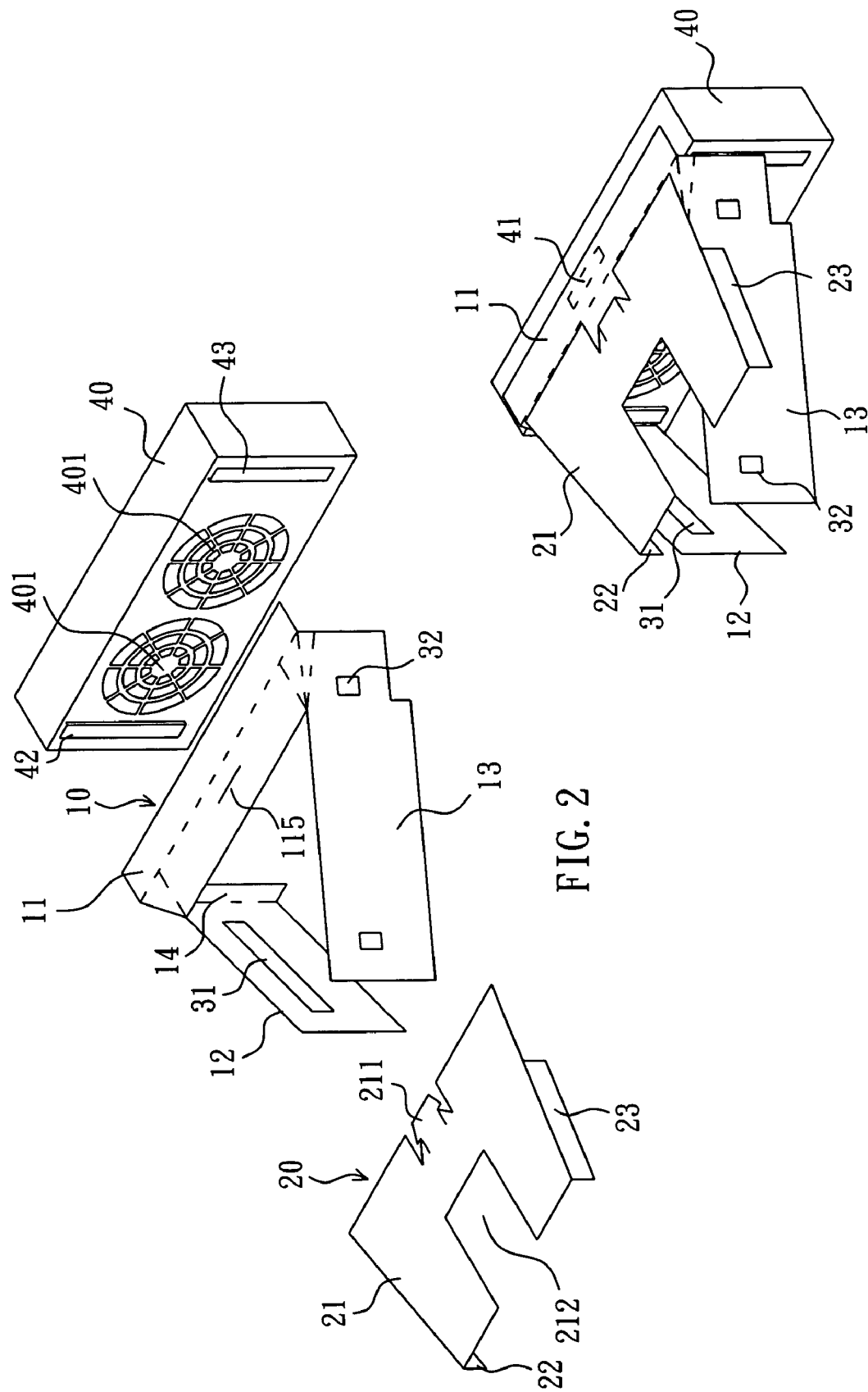

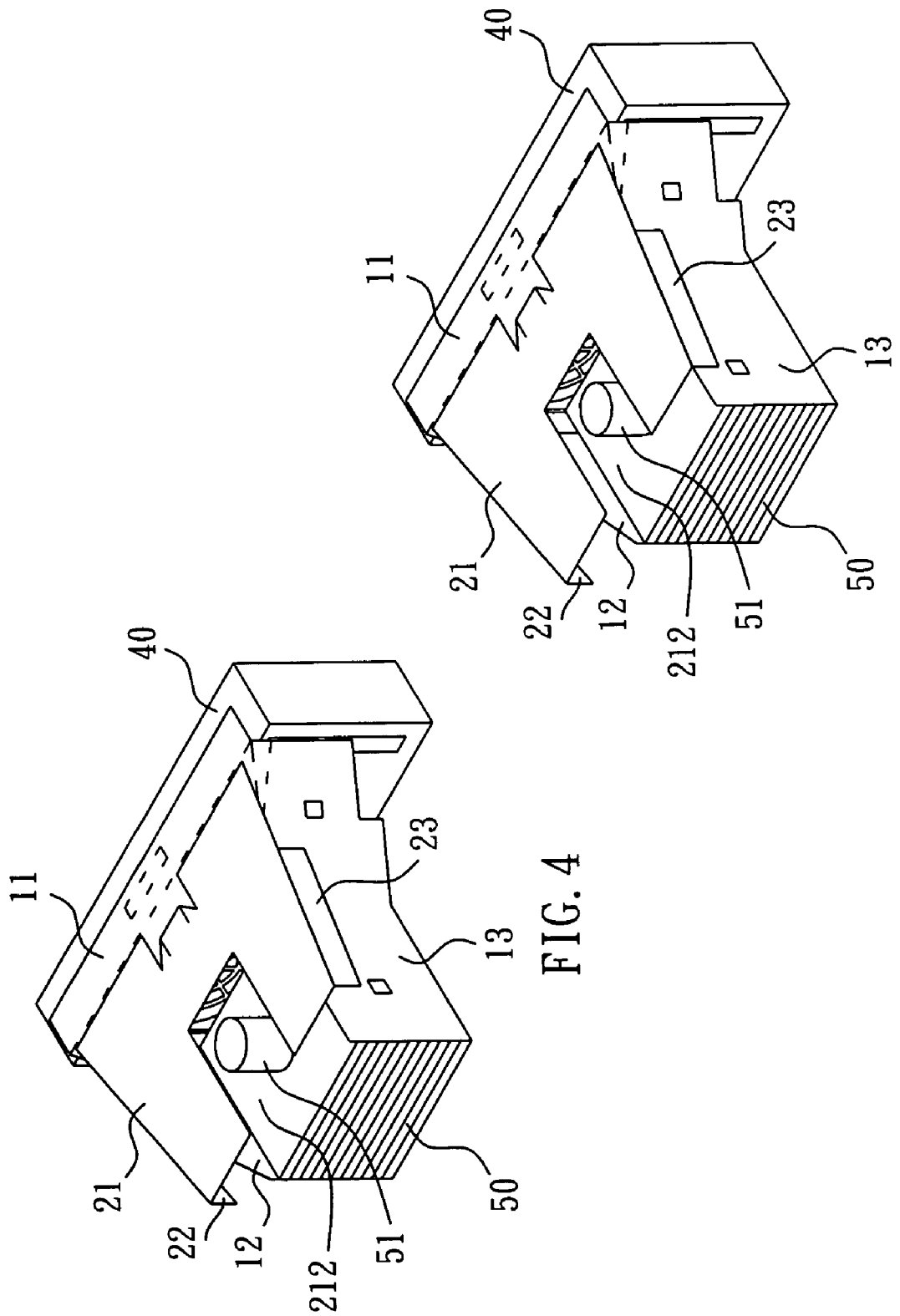

US 7,204,750 B2

AIRFLOW GUIDE STRUCTURE AND MANUFACTURE THEREOF

BACKGROUND OF THE INVENTION

1. Field of the Invention

The present invention relates to an airflow guide for a cooler in a mainframe of a computer or server, and more particularly to a airflow guide for a cooler of a central processing unit.

2. Description of Related Art

A central processing unit (CPU) is one of main elements for dissipating heat in a computer or server. An airflow guide is generally used to lead the heat dissipated from the CPU to a fan opening of a housing or power supply connected with a fan to expel it out of the housing of the computer so as to elevate the efficiency of heat dissipation. The applicant of the present invention has many patents concerning an airflow guide including Taiwan Patent No. 369,180, No. 387, 578 and No. 511,872. In addition, Taiwan Patent No. 516, 665 discloses a "Fan and Hood Arrangement", in which a fixed top nut of a mounting shell is accepted in an elongated slot of a hood. Whereby, the nut can be taken as a fulcrum for the hood to move to and fro or for the opening of the hood to rotate rightward or leftward.

Every known airflow guide mentioned above has its merit. But, every kind of the airflow guide is a fixed structure and has a fixed specification. When the specification of a cooler of a CPU and the relative position between the cooler of a CPU and the outlet of the airflow guide is slightly changed, another set of airflow guide with different specification must be reproduced to meet the requirement. As a result, the production cost of the baffle covering is increased, inventory and occupation space of baffle coverings with different specification are also increased.

SUMMARY OF THE INVENTION

The main object of the present invention is to provide an airflow guide structure, in which the shape and the dimension of a guide body can be flexibly adjusted.

Another object of the present invention is to provide an airflow guide structure, being able to be manufactured easily and to reduce the production cost.

Still another object of the present invention is to provide an airflow guide structure, having a lighter weight, a smaller dimension before assembling and being convenient on transportation and storage.

The components of an airflow guide according to the present invention are cut by molds in a factory to form thin plates in each of which has a plurality of bendable lines and transported into a mainframe assembly plant to store therein. Each component of the airflow guide is folded into a three-dimensional type at a production line when a mainframe wants to be assembled. Because each component of the airflow guide is a thin plate and lighter in weight, it can be stacked together with another component before a three-dimensional cover body is assembled. Therefore, the space is saved and the transportation and storage are more convenient.

BRIEF DESCRIPTION OF THE DRAWINGS

The present invention can be more fully understood by reference to the following description and accompanying drawings, in which:

FIG. 2 is a schematic view, showing components of an airflow guide that are folded to be three-dimensional shapes before assembling according to a first preferred embodiment of the present invention;

FIG. 3 is a three-dimensional schematic view, showing an airflow guide connected to a power supply according to a first preferred embodiment of the present invention;

FIG. 4 is a schematic view, showing an airflow guide of a first preferred embodiment according to the present invention in a usage state;

FIG. 5 is a schematic view, showing an airflow guide of a first preferred embodiment according to the present invention in another usage state;

DETAILED DESCRIPTION OF THE PREFERRED EMBODIMENTS

Figure 1B:
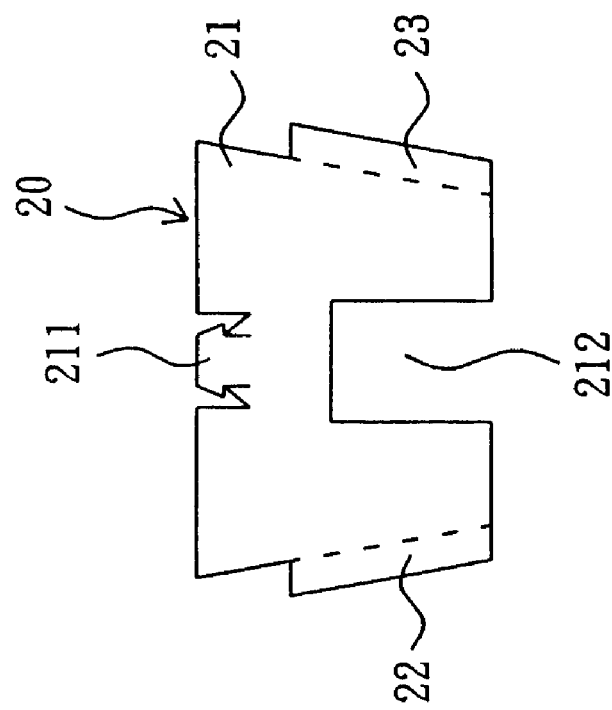
FIGS. 1A and 1B are schematic views, showing thin plate type components of an airflow guide of a first preferred embodiment according to the present invention.
Figure 1A:
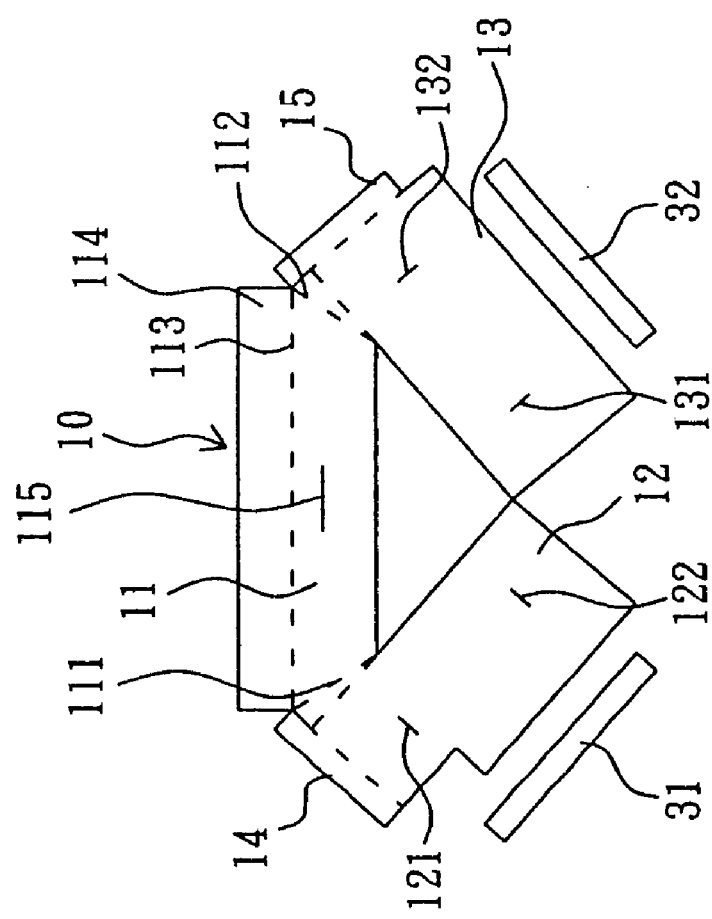

Please refer to FIGS. 1A, 1B and 2. An airflow guide of a first preferred embodiment comprises a plurality of plate bodies such as a master plate 10, a secondary plate 20 and two reinforced plates 31 and 32. The master plate 10 is formed by cutting a thin plate with a cutting mold and has a plurality of bendable lines. A front plate 11, two side plates 12, 13 and two connecting plates 14, 15 can be differentiated by bending the master plate 10 along the bendable lines, i.e., the two side plates 12 and 13 are bent at the two sides of the front plate 11 and extended under the two sides of the front plate 11 to form a guide body with the front plate 11 at the upper side and the side plates 12 and 13 at the two sides. Bendable lines 111 and 112 connected between the front plate 11 and the two side plates 12 and 13 are respectively inclined toward the inner sides of the front plates 11. Therefore, the distances between the side plates 12 and 13 are formed to be wider at the front and shorter at the rear. Another bendable line 113 is further disposed at the front plate 11 so as to allow a front end 114 of the front plate 11 to bend upward or downward around the bendable line 113, which is taken as a fulcrum. Two connecting plates 14 and 15 are respectively bent to the front ends of the two side plates 12 and 13. Cutting lines 115, 121, 122, 131 and 132 that are penetrated through the plate bodies of the front plate 11 and the two side plates 12 and 13 are respectively disposed at these plates. The two ends of the two reinforced plates 31 and 32 are respectively passed through the cutting lines 121, 122, 131 and 132 of the two side plates 12 and 13 to combine to the middle place of the two side plates 12 and 13 to strengthen the side plates 12 and 13. The secondary plate 20 is also made by cutting a thin plate with a cutting mold and has a plurality of bendable lines. A upper plate 21 and two fender plates 22 and 23 can be differentiated and bent out along the bendable lines. The two fender plates 22 and 23 to bend downward from the two sides of the upper plate 21 to allow limiting the movement range of the two side plates 12 and 13. A tenon 211 is disposed at the middle place of the front end of the upper plate 21 and a through groove 212 is disposed at the rear end thereof.

Please refer to FIGS. 1A, 1B, 2 and 3. The components of an airflow guide according to the present invention are cut by molds in a factory to form thin plates in each of which has a plurality of bendable lines, are transported in a mainframe assembly plant to store therein. Each component of the airflow guide is folded into a three-dimensional type at a production line when a mainframe wants to be assembled, namely, the master plate 10 and the secondary plate 20 is bent to three-dimensional types and the two reinforced plates 31 and 32 are respectively connected to the two side plates 12 and 13. The tenon 211 of the upper plate 21 is passed through the cutting line 115 to hook up the front plate 11 via the upper side of the front plate 11 so as to allow the upper plate 21 to combine with the front plate 11 and to cover on the two side plates 12 and 13 to form a cover. The front plate 11 according to the present invention is connected to the upper end of a housing 40 and fixed with a reusable twin adhesive 41. The two connecting plates 14 and 15 are respectively engaged in two long grooves 42 and 43 corresponding to the housing 40 to allow the master plate 10 to be connected with the housing 40 and to be covered at the outside of an exhaust exit 401. As FIG. 3 shows, the housing 40 connected with the airflow guide of the present preferred embodiment is a housing of a power supply connected with a fan, but it can also be used to connect with housings of other parts on the computer mainframe.

Please refer to FIG. 4. The cover assembled by the front plate 11, the upper plate 21 and the two side plates 12 and 13 can be used to cover the outside of a CPU heat sink 50. The through groove 212 can be used to allow a projection portion 51 of the CPU heat sink 50 to pass through. The CPU heat sink 50 can be touched flexibly owing to the flexibility of the upper plate 21 and the two side plates 12 and 13. Heat dissipated from the CPU heat sink 50 is guided by the cover and expelled out of a computer housing from the exhaust exit 401 of the housing 40 so as not to be diffused around the outside of the CPU heat sink 50.

Please refer to FIG. 5. The two side plates 12 and 13 can be bent along the bendable lines to two flank sides respectively. The side plates can be operated in coordination with different scales of CPU heat sinks 50 to adjust the distance between the side plates owing to the flexibility of their own or the locations of the CPU sinks 50, for example, when it is more close to the right side as FIG. 5 shows, the side plates can be adjusted to right or left flexibly. Therefore, a set of airflow guide can be operated in coordination with the CPU sinks 50 with a variety of specifications, sizes, dimensions and locations.

Figure 6:
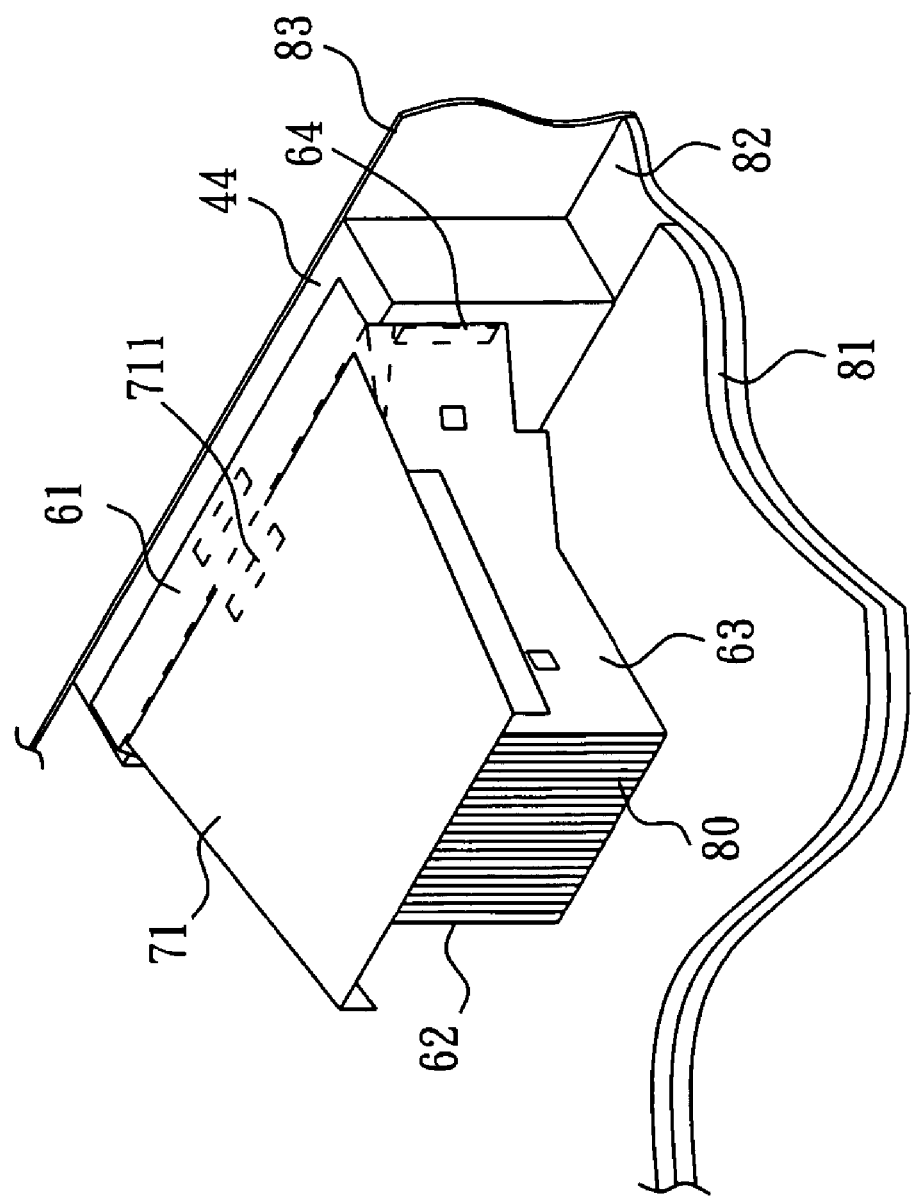
FIG. 6 is a schematic view, showing an airflow guide of a second preferred embodiment according to the present invention in a usage state.

Please refer to FIG. 6. A tenon and a through groove are not facilitated in the upper plate 71 of a second preferred embodiment according to the present invention. A reusable twin adhesive 711 is applied between the upper plate 71 and the front plate 61 to stick them together. Two connecting plate are respectively combined with the reusable twin adhesive 64 and bonded to the two flank sides without two long groves of the housing 44 of the power supply. The two side plates 62 and 63 and the upper plate 71 are covered at the two flank sides and the upper side of the CPU heat sink 80. The lower end of the CPU heat sink 80 is connected to the upper end of a motherboard 81. The lower end of the motherboard 81 is connected to the upper end of a bottom plate 82 of the computer mainframe. The housing 44 of the power supply is connected to the flank side of a side plate 83 of the housing of the computer mainframe.

Figure 7:
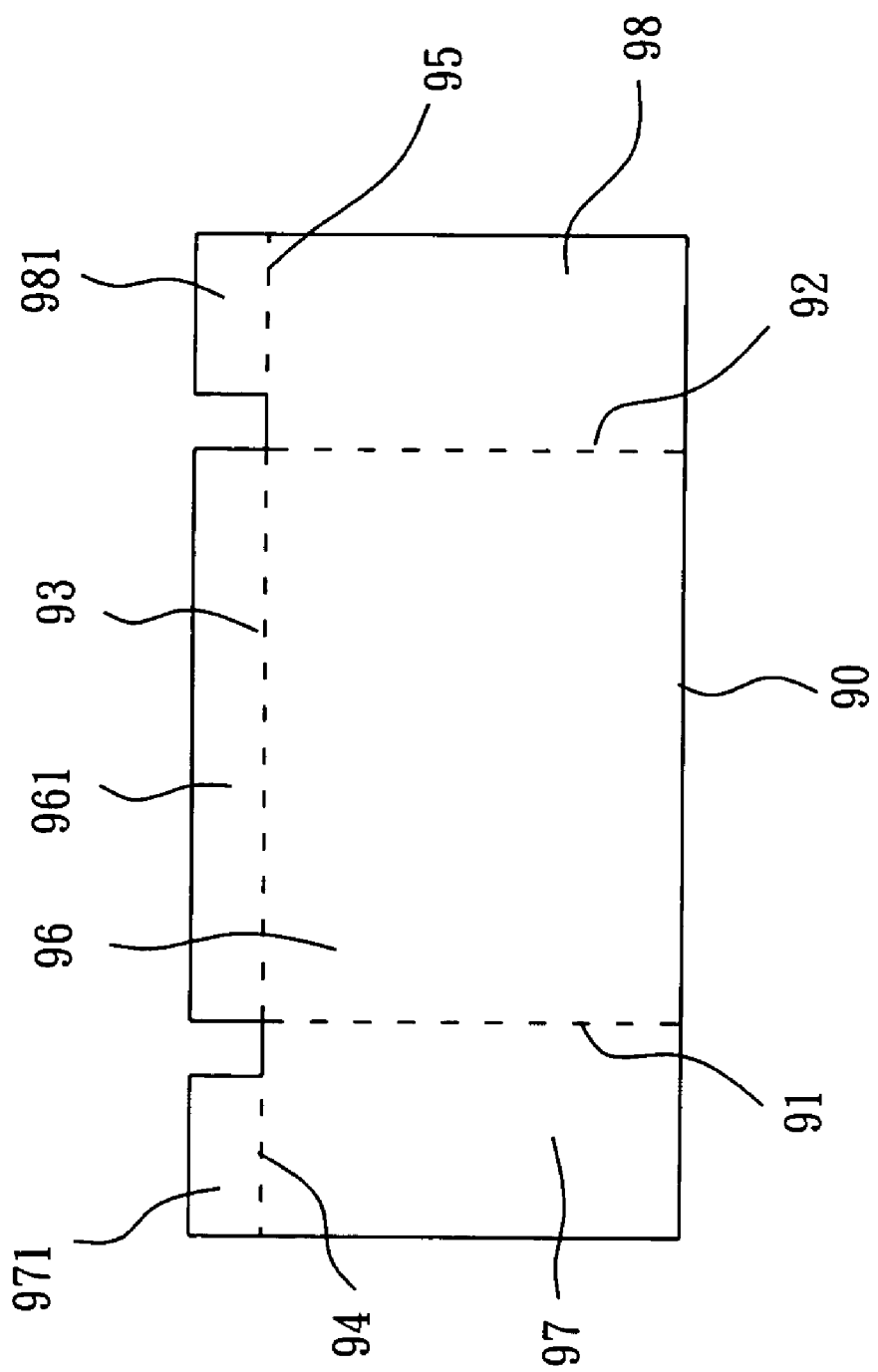
FIG. 7 is a schematic view, showing thin plate type components of an airflow guide of a third preferred embodiment according to the present invention.
Figure 8:
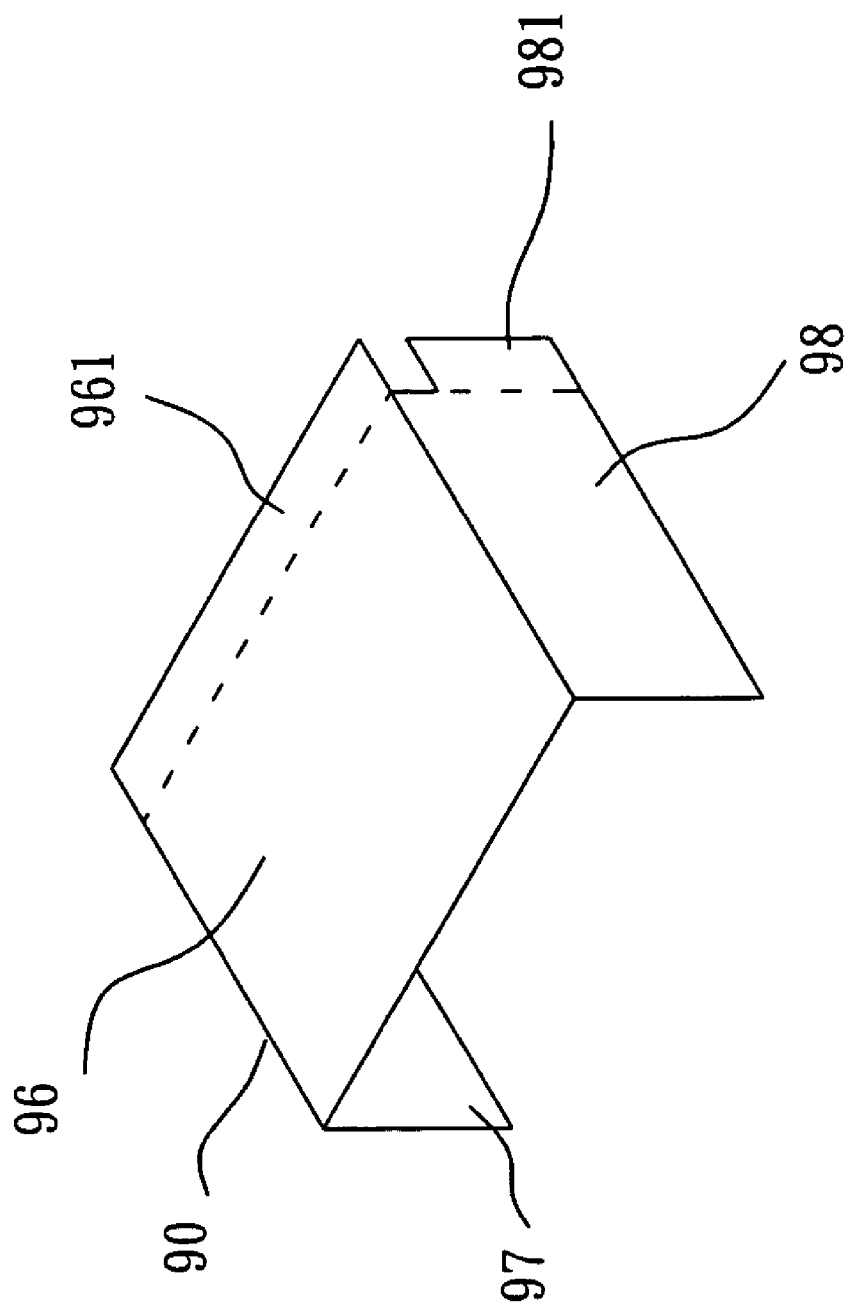
FIG. 8 is a schematic view, showing components of an airflow guide folded to be three-dimensional shapes before assembling according to a third-preferred embodiment of the present invention.

Please refer to FIGS. 7 and 8. The figures show an airflow guide of a third preferred embodiment according to the present invention. A master plate 90 is made by cutting a thin plate and has a plurality of bendable lines 91, 92, 93, 94 and 95. A upper plate 96, front end 961 of the upper plate 96, two side plates 97 and 98, and two connecting plates 971 and 981 can be differentiated and bent out along the bendable lines. The two side plates 97 and 98 can be bent at the two flank sides of the upper plate 96 shown as FIG. 8. The connecting plates 971 and 981 are respectively bent at the front ends of the side plates 97 and 98. The front end 961 of the upper plate 96 and the connecting plates 971 and 981 can respectively be connected to a housing of a power supply to allow the airflow guide to be combined with the power supply.

Figures 9A, 9B:
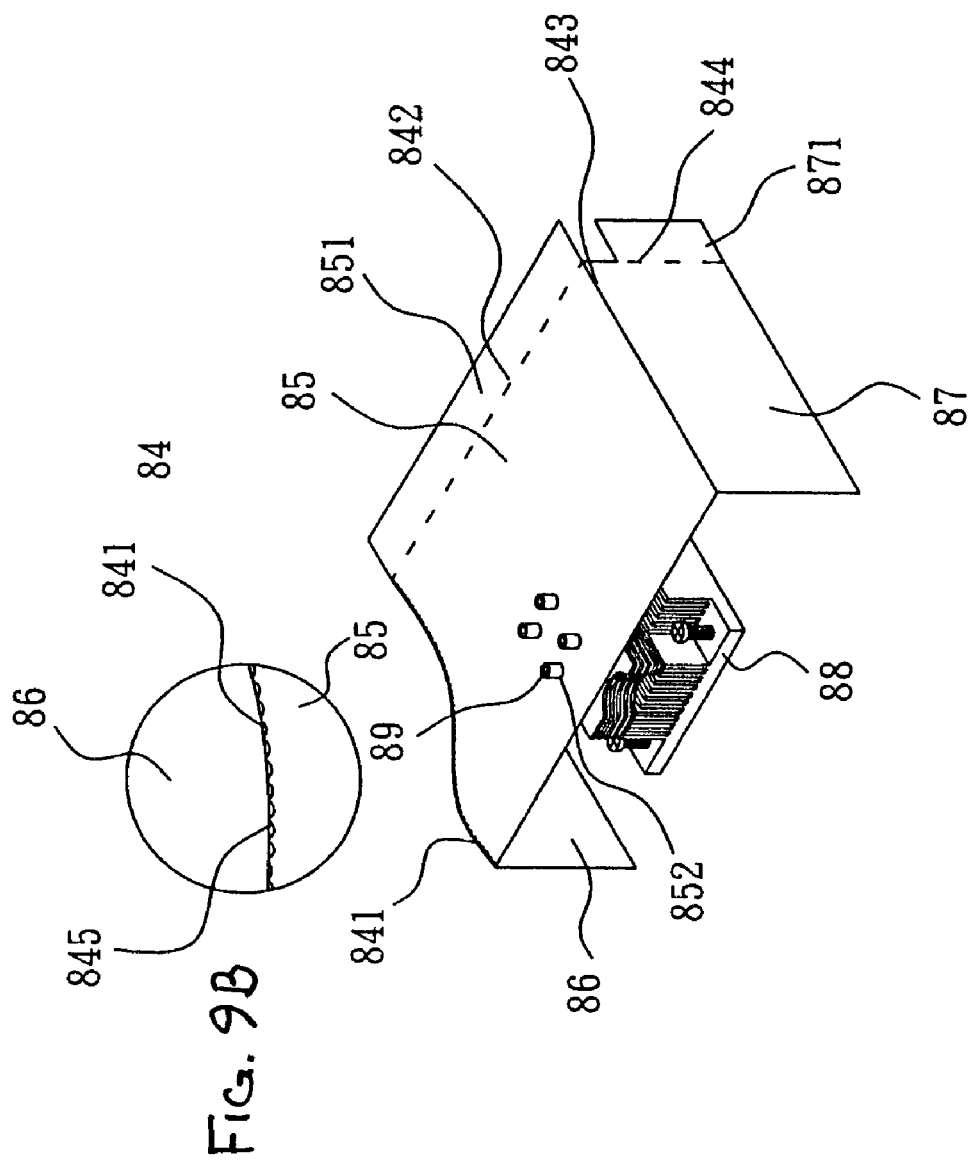
FIG. 9A is a amplified schematic view, showing a usage state and a part of bendable lines of a fourth embodiment according to the present invention.
FIG. 9B is an enlarged view of the at least one curved bendable line of the present invention.

Please refer to FIGS. 9A and 9B. The figure shows an airflow guide of a fourth preferred embodiment according to the present invention. A master plate 84 is made by cutting a thin plate and has a plurality of bendable lines 841, 842, 843 and 844. A upper plate 85, front end 851 of the upper plate 85, two side plates 86 and 87, and two connecting plates 871 (one of them is not shown in the figure). Two side plates 86 and 87 are bent at the two flank sides of the upper plate 85 to form a cover body. The two connecting plates 871 are respectively bent at the front ends of the two side plates 86 and 87. The front end 851 of the upper plate 85 and the two connecting plates 871 can respectively be connected to a housing of a power supply to allow the airflow guide to be combined with the housing of the power supply. A characteristic of the embodiment is to allow at least one curved bendable line 841 in the master plate 84 to have a plurality of small holes 845 so that it can be bent a needed curve along the small holes 845 to cause the two flank sides of the airflow guide to match with the shapes of electronic components at the two sides to perform a necessary curved deformation. Besides, at least one hole 852 is disposed in the upper plate 85 for a projecting column at the upper end of a cooler 88 of a CPU to be passed through. The part of the projecting column passed out the hole 852 is connected to a fixing element 89 to allow the upper plate 85 to be connected to the upper end of the cooler 88 of the CPU. The fixing element 89 can be a screw nut or a pressing rubber sleeve.

Please refer to FIG. 6 again. Another use manner according to the present invention is to bend the front end of the front plate 61 upward. The front plate 61 along with the two connecting plates can be bonded directly onto the side plate 83 of the housing or side plates of housings of other elements by using reusable twin adhesive to allow the airflow guide to be assembled at the flank side of the side plates.

The master plate, the secondary plate and the two reinforced plates can be made through template cutting. Materials of theirs can be a metal thin plate, paper plate or plastic thin plate, such as a thin plate made from polypropylene, preferably a plate with fireproof, heat resistant, antimagnetic and anti-static electric function. The manufacturing of the template used in cutting is cheaper and faster; a production cost can be reduced. Each component is lighter owing to its thin plate type; all the components can be stacked together when they are not assembled to be a three-dimensional cover body. Therefore, they occupy less space and are convenient in transportation and storage.

Figure 10:
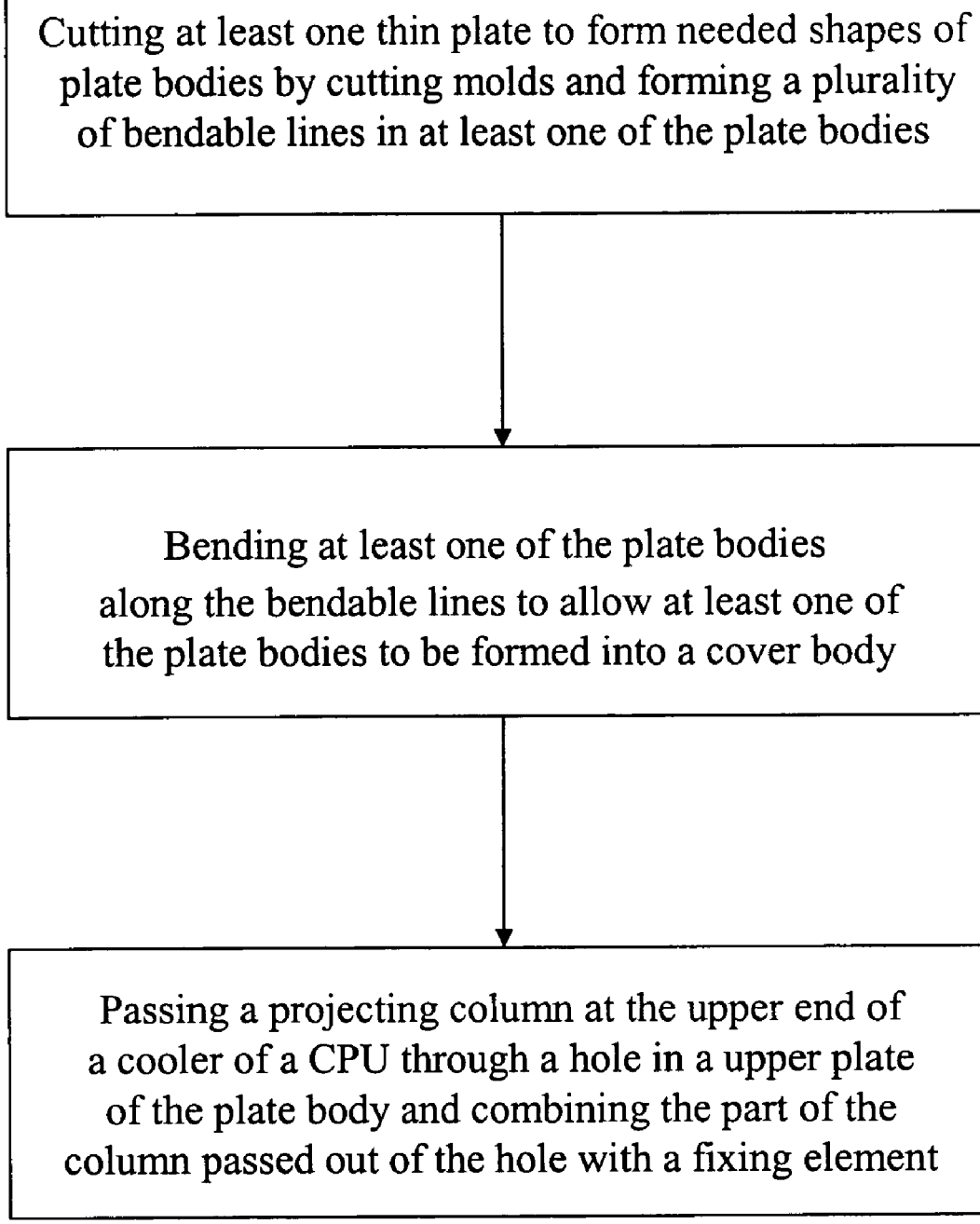
FIG. 10 is a flow chart, showing manufacturing steps of an airflow guide according to the present invention.

Please refer to FIG. 10. A manufacturing method of an airflow guide according to the present invention comprises the following steps:

Cutting at least one thin plate to form needed shapes of plate bodies by cutting molds and forming a plurality of bendable lines in at least one of the plate bodies;

Bending at least one of the plate bodies along the bendable lines to allow at least one of the plate bodies to be formed into a cover body; and Passing a projecting column at the upper end of a cooler of a CPU through a hole in a upper plate of the plate body and combining the part of the column passed out of the hole with a fixing element.

The components of an airflow guide according to the present invention are cut by molds in a factory to form thin plates in each of which has a plurality of bendable lines and transported into a mainframe assembly plant to store therein. Each component of the airflow guide is folded into a three-dimensional type at a production line when a mainframe wants to be assembled. Because each component of the airflow guide is a thin plate and lighter in weight, it can be stacked together with another component before a three-dimensional cover body is assembled. Therefore, the space is saved and the transportation and storage are more convenient.

It is noted that the airflow guide structure described above is the preferred embodiment of the present invention for the purpose of illustration only, and are not intended as a definition of the limits and scope of the invention disclosed. Any modifications and variations that may be apparent to a person skilled in the art are intended to be included within the scope of the present invention.

What is claimed is:

1. An air flow guide structure for directing an air flow on a flank side of an exhaust exit of a housing of an electronic device, the air flow guide structure comprising:
   a) a master plate having:
      I) a front plate connected to the housing;
      ii) two side plates, one of the two side plates extending below each of two opposing sides of the front plate; and
      iii) two connecting plates, one of the two connecting plates extending from each of the two side plates and connected to a surface of the housing at each of two opposing ends thereof; and
   b) a secondary plate having:
      I) an upper plate connected to the front plate; and
      ii) two fender plates, one of the two fender plates extending downwardly from each of two opposing sides of the upper plate and covering a predetermined portion of each of the two side plates.

2. The air flow guide structure according to claim 1, wherein the two side plates are spaced apart a greater distance at first ends thereof than at a second ends thereof, the first ends are located adjacent to the two connecting plates.

3. The air flow guide structure according to claim 1, wherein the front plate having a bendable line allowing a protruding section thereof to be selectively bent one of upwardly and downwardly.

4. The air flow guide structure according to claim 1, further comprising two reinforcing plates, each of the two side plates having two cutting lines, one of the two reinforcing plates is inserted through the two cutting lines of each of the two side plates.

5. The air flow guide structure according to claim 4, wherein the master plate, the secondary plate, and the two reinforcing plates are made of a material selected from a group consisting of metal, paper, plastic, and polypropylene.

6. The air flow guide structure according to claim 1, wherein the front plate having a cutting line, the upper plate having a tenon, the tenon is inserted into the cutting line connecting the upper plate to the front plate.

7. The air flow guide structure according to claim 1, further comprising an reusable twin adhesive, the upper plate is connected to the front plate by the reusable twin adhesive.

8. The air flow guide structure according to claim 1, wherein the upper plate having a groove located through one end.

9. The air flow guide structure according to claim 1, further comprising an reusable twin adhesive, the front plate and the two connecting plates are connected to the housing by the reusable twin adhesive.

10. An air flow guide structure for directing an air flow on a flank side of an exhaust exit of a housing of an electronic device, the air flow guide structure comprising:
    a master plate having:
    a) a front plate connected to the housing;
    b) two side plates, one of the two side plates extending below each of two opposing sides of the front plate; and
    c) two connecting plates, one of the two connecting plates extending from each of the two side plates and connected to a surface of the housing at each of two opposing ends thereof,
    wherein a plurality of fold lines are located between each of the front plate and the two side plates, and the two connecting plates and the two side plates, at least one of the plurality of fold lines is a curved bendable line having a plurality of holes located along a length of thereof.

11. The air flow guide structure according to claim 10, wherein the front plate having a bendable line allowing a protruding section thereof to be selectively bent one of upwardly and downwardly.

12. The air flow guide structure according to claim 10, further comprising a fixing element, the front plate having at least one through hole, a projection portion of the electronic device being inserted through each of the at least one through hole, each projection portion being connected to the fixing element securing the master plate to the electronic device.

13. The air flow guide structure according to claim 12, wherein the fixing element is a rubber sleeve.

14. A method for manufacturing an air flow guide structure for directing an air flow on a flank side of an exhaust exit of a housing of an electronic device, which comprises the steps of:
    a) cutting at least one thin plate into a plurality of plate bodies, each of the plurality of plate bodies having a plurality of bendable lines;
    b) bending at least one of the plurality of plate bodies along the plurality of bendable lines and forming a master plate having a front plate, a side plate extending downwardly from each of two opposing sides of the front plate, and a connecting plate extending from one end of each side plate; and
    c) connecting the front plate and each connecting plate to the housing of the electronic device,
    wherein the bending and forming step b) includes bending at least one of the plurality of plate bodies along the plurality of bendable lines and forming a secondary plate having an upper plate, a fender plate extending downwardly from each of two opposing sides of the upper plate.

* * * * *